(12) United States Patent
Tseng et al.

(10) Patent No.: US 12,387,640 B2
(45) Date of Patent: Aug. 12, 2025

(54) METHOD OF MAKING DISPLAY DEVICE (71) Applicant: HON HAI PRECISION INDUSTRY CO., LTD., New Taipei (TW)

(72) Inventors: Te-En Tseng, New Taipei (TW); Tsai-Yi Chien, New Taipei (TW)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 407 days.

(21) Appl. No.: 17/555,425

(22) Filed: Dec. 18, 2021

(65) Prior Publication Data
US 2022/0198972 A1 Jun. 23, 2022

(30) Foreign Application Priority Data

Dec. 18, 2020 (CN) .......................... 202011505924.9

(51) Int. Cl.
H01L 25/075 (2006.01)
G09G 3/00 (2006.01)
G09G 3/32 (2016.01)

(52) U.S. Cl.
CPC .............. G09G 3/006 (2013.01); G09G 3/32 (2013.01); H01L 25/0753 (2013.01); G09G 2300/0443 (2013.01); G09G 2340/0407 (2013.01)

(58) Field of Classification Search
CPC .. G09G 3/006; G09G 3/32; G09G 2300/0443; G09G 2340/0407; H01L 25/0753
USPC .......................................................... 438/15
See application file for complete search history.

(56) References Cited

U.S. PATENT DOCUMENTS

| 7,592,970 | B2 | 9/2009 | Matthies et al. | |
| 10,038,171 | B2 | 7/2018 | Sakuishi et al. | |
| 2011/0291550 | A1* | 12/2011 | Kim | H10K 59/352 |
| | | | | 313/504 |
| 2017/0039990 | A1* | 2/2017 | Song | G09G 3/2003 |
| 2017/0053589 | A1 | 2/2017 | Huang et al. | |
| 2019/0080970 | A1* | 3/2019 | Chaji | G09G 3/2014 |
| 2019/0318706 | A1* | 10/2019 | Peng | G09G 3/007 |
| 2020/0411717 | A1* | 12/2020 | Keates | H01L 33/0095 |

FOREIGN PATENT DOCUMENTS

| CN | 106469540 | 3/2017 |
| TW | 201721618 A | 6/2017 |
| TW | 202006660 A | 2/2020 |
| TW | 202044537 A | 12/2020 |

* cited by examiner

*Primary Examiner* — Dzung Tran
(74) *Attorney, Agent, or Firm* — ScienBiziP, P.C.

(57) ABSTRACT

A method of making a display device includes: forming light-emitting elements on a substrate; each sub-pixel including one light-emitting element; the light-emitting elements arranged in a array, the display device defining a plurality of pixels, each of pixel including 2*2 sub-pixels, the light-emitting elements in each pixel configured to emit light of same color; detecting whether each light-emitting element is defective and recording positions of the light-emitting elements that are defective; setting a resolution of the display device to be a maximum resolution when it is detected that there is no defective light-emitting element; setting a resolution of the display device to be an adjustment resolution when it is detected that there are defective light-emitting elements. The adjustment resolution is less than the maximum resolution.

10 Claims, 7 Drawing Sheets

METHOD OF MAKING DISPLAY DEVICE

FIELD

The subject matter herein generally relates to a method of making display devices.

BACKGROUND

A method of making micro light emitting diode (micro-LED) display device includes making a light-emitting element array consisting of a plurality of micro LEDs. During the making process, some micro LEDs in the light-emitting element array will be found defective.

After a great number of micro LEDs are transferred onto a designated substrate for positioning and bonding, repairing the defective micro LED particles is problematic. The defective micro LEDs in the light-emitting element array can be repaired by ultraviolet irradiation maintenance technology, laser fusing maintenance technology, or selective laser maintenance technology. Alternatively, an additional standby micro LED is designed for each micro LED particle in the micro LED array in the form of a backup circuit design. However, the micro LED is very small, and a distance between two adjacent micro LEDs is microscopic, so it is difficult and complex to repair defective micro LEDs. The cost of backup circuit design is also high.

BRIEF DESCRIPTION OF THE DRAWINGS

Implementations of the present technology will now be described, by way of embodiments only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

The term "Bayer format" in this disclosure refers to an arrangement format of sub-pixels to present digital images invented by Bryce Bayer, a scientist of Eastman Kodak company, the format being also known as Bayer array. Human eyes are sensitive to green, so in the Bayer format, a number of the green (G) sub-pixels is equal to the sum of red (R) and blue (B) sub-pixels. The Bayer array thus comprises 50% green sub-pixels, 25% red sub-pixels, and 25% blue sub-pixels. In the Bayer array, 2*2 sub-pixels of adjacent rows and adjacent columns are two green sub-pixels, one red sub-pixel, and one blue sub-pixel.

The term "resolution" in this disclosure refers to a number of pixels contributing to the display by the display device. When a size of the display device is fixed, the higher the resolution, the clearer will be the image.

Figure 1:
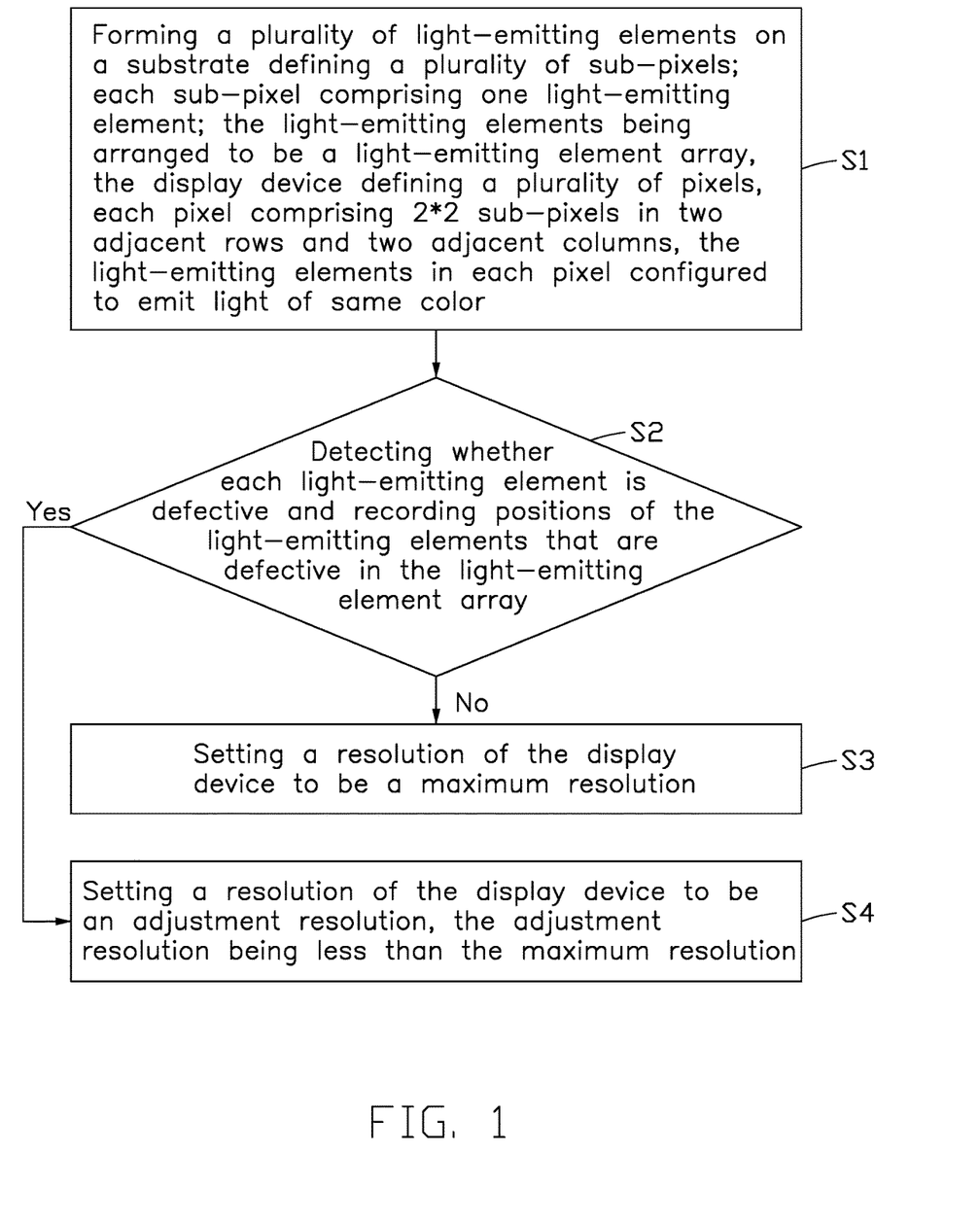
FIG. 1 is a flowchart of a method of making a display device according to an embodiment of the present disclosure.

Referring to FIG. 1, a method of making the display device in an embodiment of the present disclosure includes the following steps.

Step S1: forming a plurality of light-emitting elements on a substrate defining a plurality of sub-pixels. The plurality of sub-pixels is arranged to be a light-emitting element array. Each sub-pixel includes one light-emitting element. A pixel is formed by four adjacent sub-pixels, 2*2 sub-pixels of each pixel are located in adjacent rows and adjacent columns, and the four light-emitting elements in each pixel emit light of same color.

Step S2: detecting defective light-emitting elements and recording their positions in the light-emitting element array.

When no defective light-emitting elements are detected in the light-emitting element array, execute step S3, the resolution of the display device including the light-emitting element array to be set at a maximum resolution.

When defective light-emitting elements are detected in the light-emitting element array, execute step S4, and the resolution of the display device including the light-emitting element array is set to be an adjustment resolution, and the adjustment resolution is less than the maximum resolution.

The method is applicable to active light-emitting display devices, such as micro-LED display devices and organic light emitting diode (OLED) display devices. The light-emitting element can be a micro LED or an OLED.

Figure 2:
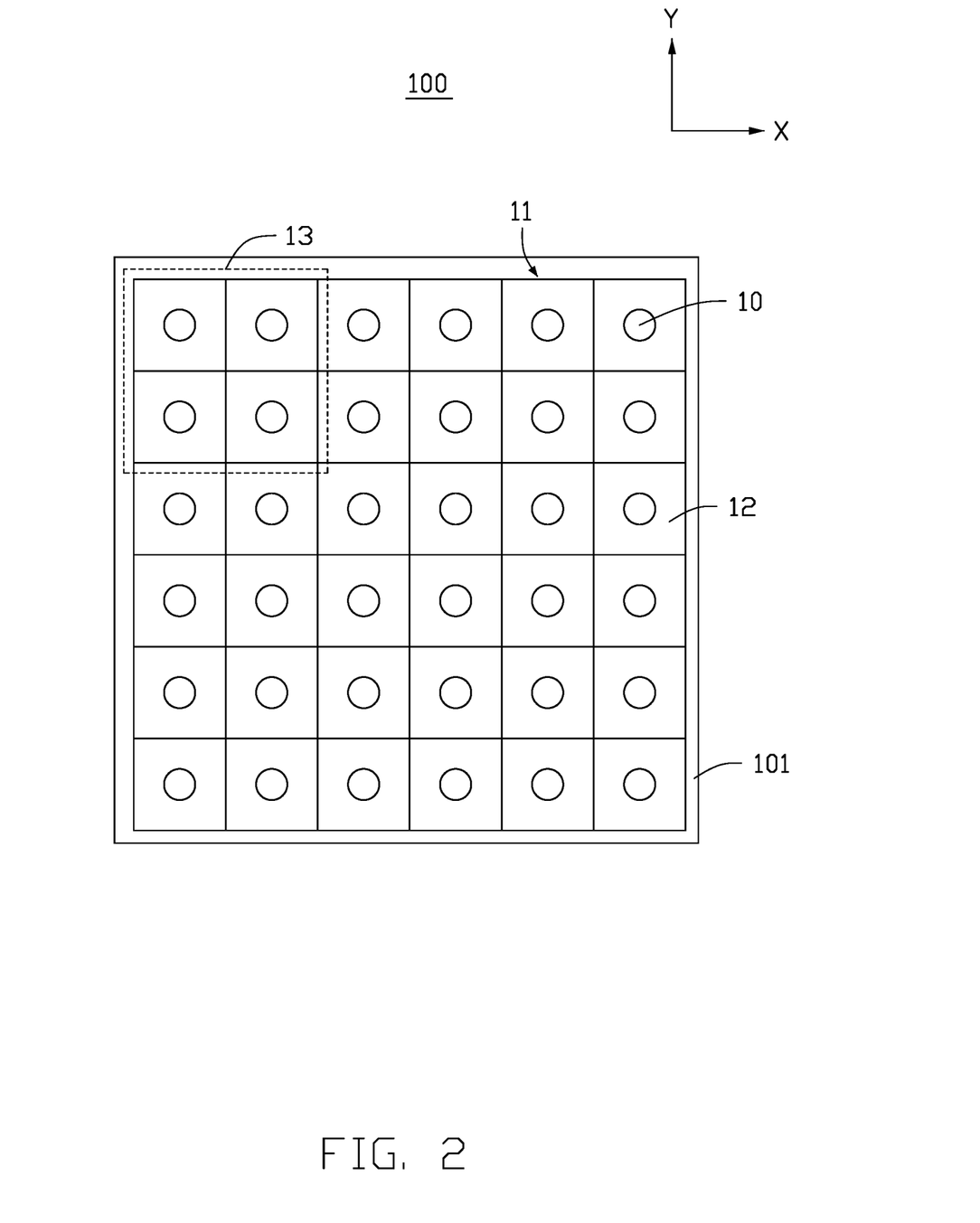
FIG. 2 is a view of a light-emitting element array composed of light-emitting elements in the display device according to an embodiment of the present disclosure.

As shown in FIG. 2, in the present embodiment, the light-emitting elements 10 are configured to emit light to display images that is to emit image light according to image data signals. If all of the light-emitting elements 10 emit light can function properly, the display device has a maximum resolution (i.e., all the pixels in the display device).

In step S1, a driving circuit (not shown) for driving the light-emitting elements 10 to emit light may be on the substrate 101, and the substrate 101 defines a plurality of sub-pixels 12. Each sub-pixel 12 includes one light-emitting element 10. Four sub-pixels 12 form one pixel 13, and there are many pixels 13 not overlapping with each other on the substrate 101. The four sub-pixels 12 of each pixel 13 are located in adjacent rows and adjacent columns. The four light-emitting elements 10 in the same pixel 13 emit light of one color that is one selected from the three RGB primary colors, thus each pixel 13 emits light of a single color.

As shown in FIG. 2, each small square represents one sub-pixel 12, and the dotted box represents one pixel 13. In the embodiment shown in FIG. 2, each sub-pixel 12 has approximately a same area, and an arrangement of four sub-pixels 12 in each pixel 13 is rectangular. In one embodiment, the light-emitting elements 10 are micro-LEDs, and the step of forming the light-emitting element array 11 on the substrate 101 includes transferring the light-emitting elements 10 to specified positions of the substrate 101 for bonding, so that each light-emitting element 10 is electrically connected to the driving circuit and can be driven to emit light independently.

In the present embodiment, all of the light-emitting elements 10 emit light of one color. The light-emitting element array 11 emits monochromatic light, and the display device 100 may itself be a monochrome display device. In this embodiment, all light-emitting elements 10 emit either R or G or B light.

Figure 3:
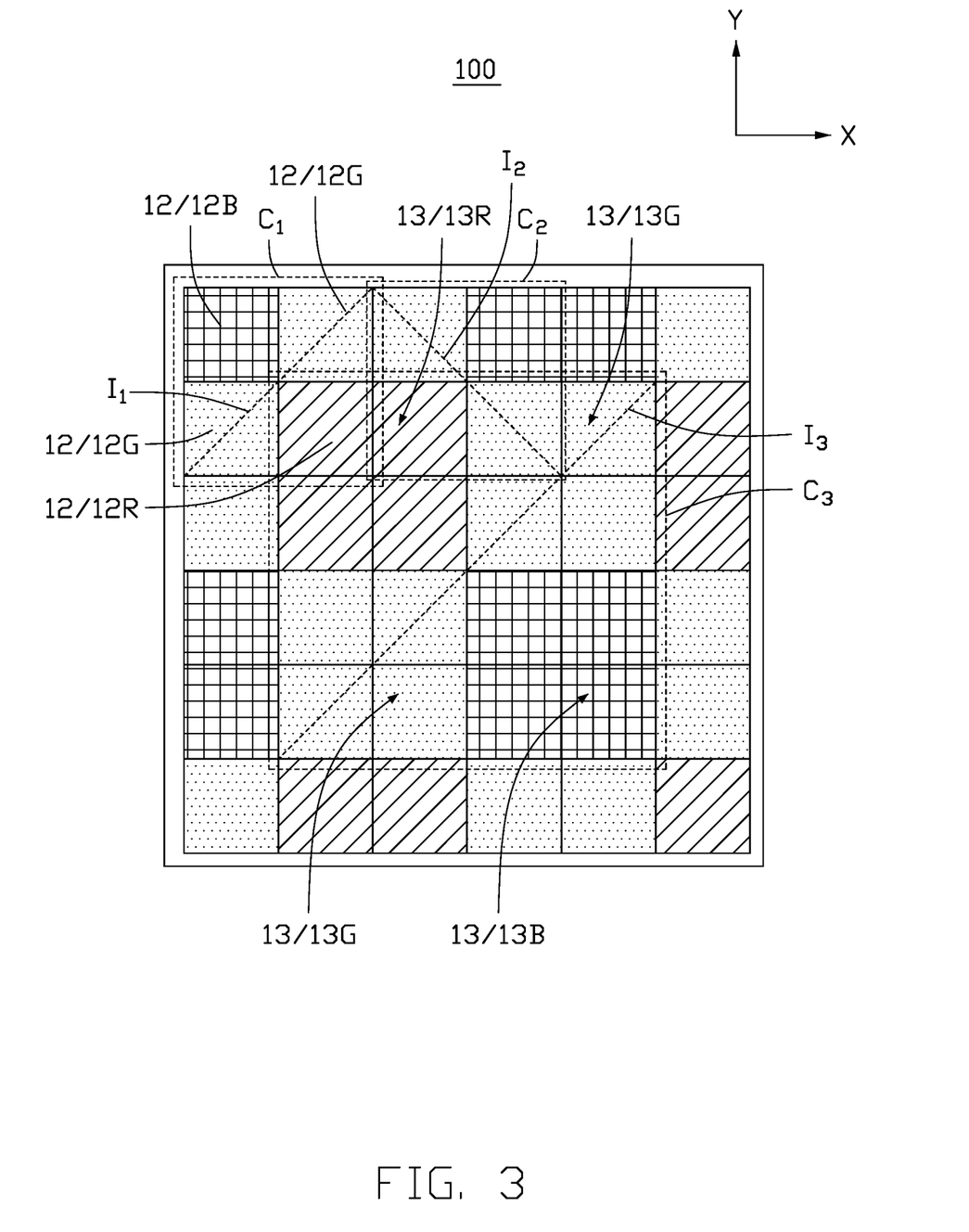
FIG. 3 is a view of a light-emitting element array in which all pixels and all sub-pixels are arranged in Bayer format according to an embodiment of the present disclosure.

As shown in FIG. 3, the display device 100 is a multicolor display device (a full-color array display device), and the light-emitting elements 10 of the light-emitting element array 11 can emit light of different colors. In one embodiment, each light-emitting element 10 emits light of one color selected from the three primary colors of red, green, and blue (RGB), and all of the pixels 13 and all of the sub-pixels 12 are set to be the Bayer array format. The Bayer array format is a type of full-color array. In the Bayer array format consisting of all sub-pixels 12, there are a plurality of first units C1 and a plurality of second units C2. Each first unit C1 is consisting of 2*2 sub-pixels 12 including two green sub-pixels 12G emitting green light along a first diagonal l1, one red sub-pixel 12R emitting red light, and one blue sub-pixel 12B emitting blue light. Each second unit C2 is consisting of 2*2 sub-pixels 12 including two green sub-pixels 12G emitting green light along a second diagonal l2, one red sub-pixel 12R emitting red light, and one blue sub-pixel 12B emitting blue light. The first diagonal l1 and the second diagonal l2 are perpendicular to each other, and the first unit C1 and the second unit C2 are alternately distributed in the X and Y directions to form the Bayer array format composed of all sub-pixels 12. In the Bayer array format consisting of all pixels 13, there is a plurality of third units C3. Each third unit C3 is consisting of 2*2 pixels 13 including two green pixels 13G emitting green light distributed along a third diagonal l3, one red pixel 13R emitting red light, and one blue pixel 13B emitting blue light. The third units C3 are distributed in a repeating manner in the X and Y directions to form the Bayer array format composed of all pixels 13. In this embodiment, the third diagonal l3 is parallel to the first diagonal l1. The order in which the first units C1 and the second units C2 are alternately distributed in the X and Y directions affects a diagonal distribution of the green pixel 13G emitting green light. It can be understood that when the pixels 13G emitting green light are distributed along the third diagonal l3 parallel to the first diagonal l1, the order of the alternating distribution of the first unit C1 and the second unit C2 in the X and Y directions is also determined, which ensures that all of the pixels 13 and all of the sub-pixels 12 in the light-emitting element array 11 form the Bayer format arrangement.

In other embodiments, the third diagonal l3 involving the two green pixels 13G emitting green light may be parallel to the second diagonal l2. The situation of the green pixels 13G emitting green light being distributed along the third diagonal l3 is different from that in FIG. 3; and an alternating order of the first unit C1 and the second unit C2 when distributed in the X and Y directions is also opposite to that in FIG. 3.

The X and Y directions are shown in FIG. 3, these directions being perpendicular to each other. The meaning of the alternating distribution is that two adjacent first units C1 in both the X direction and the Y direction are separated by one second unit C2, and two adjacent second units C2 in both the X direction and the Y direction is separated by one first unit C1. In other embodiments, in the Bayer array format consisting of all sub-pixels 12, a first unit C1 is consisting of 2*2 sub-pixels and includes two green sub-pixels 12G emitting green light, one red sub-pixel 12R emitting red light, and one blue sub-pixel 12B emitting blue light. The two green sub-pixels 12G in the first unit C1 are located in a same row, and the red sub-pixel 12R and the blue sub-pixel 12B are located in another row. In the Bayer array format consisting of all pixels 13, a third unit C3 is consisting of 2*2 pixels and includes two green pixels 13G emitting green light, one red pixel 13R emitting red light, and one blue pixel 13B emitting blue light. The two green pixels 13G in the third unit C3 are located in a same row, and the red pixel 13R and the blue pixel 13B are located in another row.

In a second embodiment, all of the pixels 13 and all of the sub-pixels 12 are set to be full-color array. The light-emitting element array 11 involves sub-pixels 12 of RGB colors or sub-pixels 12 of more than three different colors. Specifically, there are first units C1, second units C2, and third units C3 in the full-color array consisting of all of the sub-pixels 12. Each first unit C1 is consisting of 2*2 sub-pixels 12 and includes two red sub-pixels 12R emitting red light distributed in the first diagonal l1, one green sub-pixel 12G emitting green light, and one blue sub-pixel 12B emitting blue light. Each second unit C2 is consisting of 2*2 sub-pixels 12 and includes two red sub-pixels 12R emitting red light distributed in the second diagonal l2, one green sub-pixel 12G emitting green light, and one blue sub-pixel 12B emitting blue light. Each third unit C3 is consisting of 2*2 pixels 13 and includes two red pixels 13R emitting red light distributed in the third diagonal l3, one green pixel 13G emitting green light, and one blue pixel 13B emitting blue light.

In a third embodiment, all of the pixels 13 and all of the sub-pixels 12 are set to be full-color array. The light-emitting element array 11 involves sub-pixels 12 of RGB colors or sub-pixels 12 of more than three different colors. Specifically, there are first units C1, second units C2, and third units C3 in the full-color array consisting of all sub-pixels 12. Each first unit C1 consisting of 2*2 sub-pixels 12 includes two blue sub-pixels 12B emitting blue light distributed in the first diagonal l1, one green sub-pixel 12G emitting green light, and one red sub-pixel 12R emitting red light. Each second unit C2 is consisting of 2*2 sub-pixels 12 and includes two blue sub-pixels 12B emitting blue light distributed in the second diagonal l2, one green sub-pixel 12G emitting green light, and one red sub-pixel 12R emitting red light. Each third unit C3 is consisting of 2*2 pixels 13 and includes two blue pixels 13B emitting blue light distributed in the third diagonal l3, one green pixel 13G emitting green light, and one red pixel 13R emitting red light.

In a fourth embodiment, all of the pixels 13 and all of the sub-pixels 12 are set to be full-color array. The light-emitting element array 11 involves sub-pixels 12 of RGB colors or sub-pixels 12 of more than three different colors. Each light-emitting element emits red light, green light, or blue light. Specifically, there are first units C1, second units C2, and third units C3 in the full-color array consisting of all sub-pixels 12. Each first unit C1 and each second unit C2 are consisting of 2*2 sub-pixels 12 and include one blue sub-pixel 12B emitting blue light, one green sub-pixel 12G emitting green light, one red sub-pixel 12R emitting red light, and one white sub-pixel (not shown) emitting white light. Each third unit C3 is consisting of 2*2 pixels 13 and includes one blue pixel 13B emitting blue light, one green pixel 13G emitting green light, one red pixel 13R emitting red light, and one white pixel (not shown) emitting white light.

In step S2, a location of the light-emitting element 10 in the light-emitting element array 11 is specifically its exact position in the X direction and Y direction of the light-emitting element array 11. The X and Y directions are shown in FIG. 2 and FIG. 3, and the X direction and Y direction are perpendicular to each other. In the present embodiment, in step S2, a circuit detection method is used to detect whether there are defective light-emitting elements 10 in the light-emitting element array 11. That is, each light-emitting element 10 is driven to emit light by the circuit, and the light-emitting element 10 emitting light or no light and whether the brightness is normal or abnormal are detected. When the light-emitting element 10 does not emit light, it is determined as a defective light-emitting element. If the luminance of the light-emitting element 10 is lower than a predetermined luminance, it is also determined as a defective light-emitting element.

Figure 4:
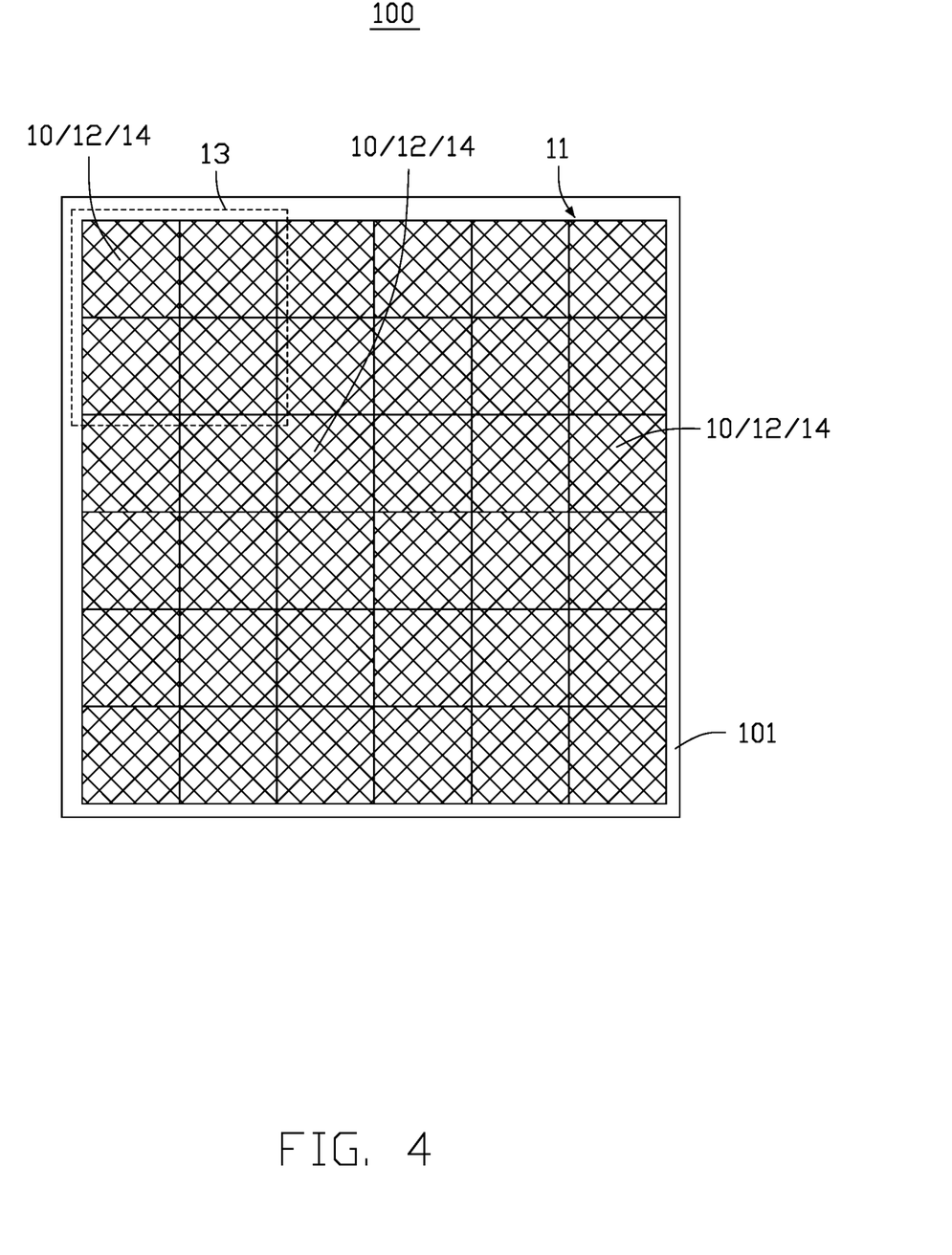
FIG. 4 is a view when all pixels are emitting light of the same color and there is no defective light-emitting element in the light-emitting element array, according to an embodiment of the present disclosure.

In step S3, when no defective light-emitting element 10 is detected in the light-emitting element array 11 and the light-emitting colors of the light-emitting elements 10 of all pixels 13 are the same (i.e., when the display device 100 is a monochrome display device), each light-emitting element 10 of the light-emitting element array 11 is invoked to participate in displaying images, and each sub-pixel 12 is a pixel unit 14 when the light-emitting element array 11 performs a light-emitting display, as shown in FIG. 4. That is, a resolution of the display device 100 is set to be a maximum resolution. One pixel unit 14 is an image pixel during image display, that is, a minimum display unit during image display.

In step S3, when all of the pixels 13 and all of the sub-pixels 12 are set to be full-color array and no defective light-emitting elements 10 are detected in the light-emitting element array 11, 2*2 sub-pixels 12 distributed in two adjacent rows and two columns are configured as one pixel unit 14 of the display device 100.

Figure 5:
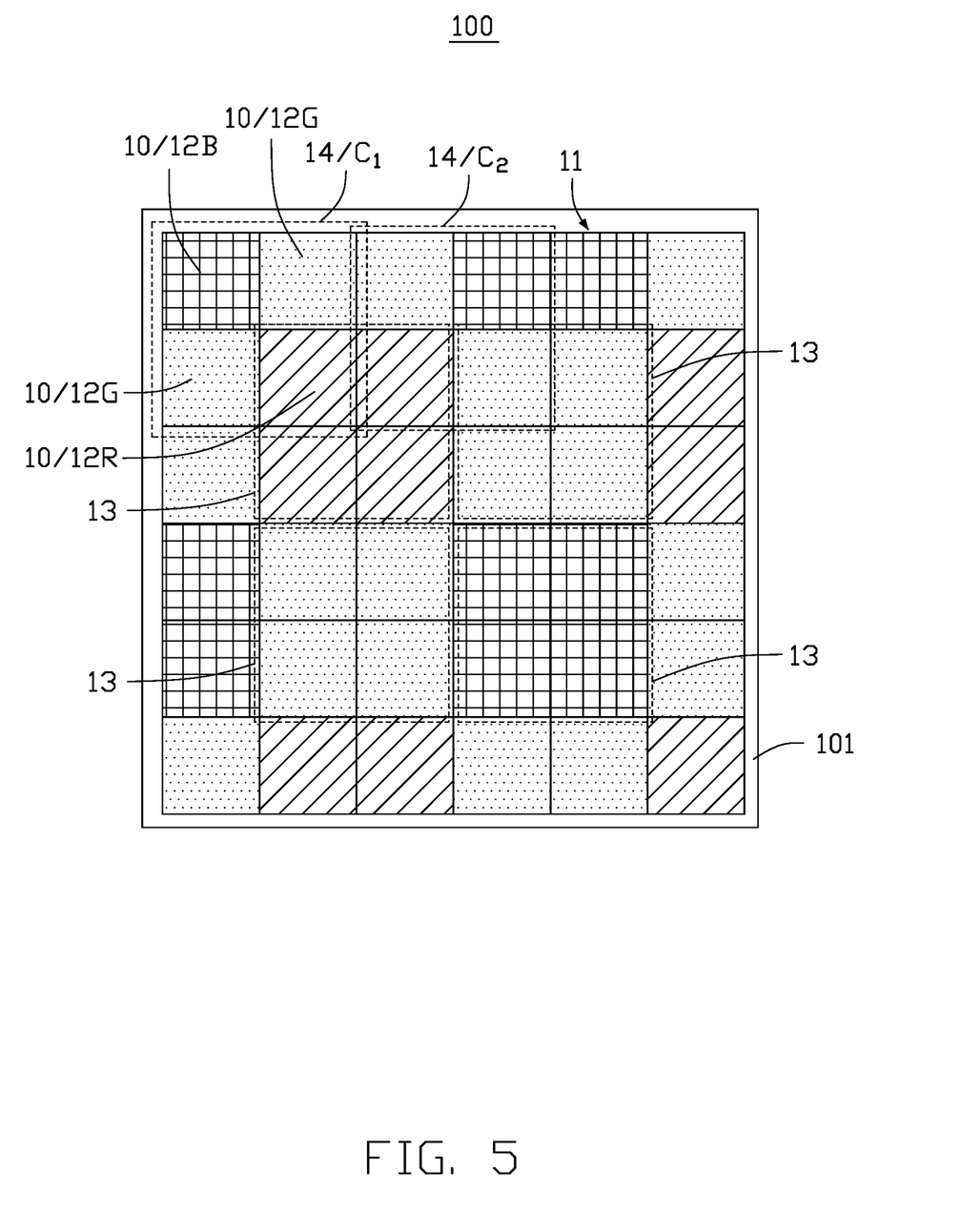
FIG. 5 is a view when the light-emitting element array is arranged as shown in FIG. 4 and there are no defective light-emitting elements in the light-emitting element array.

In one embodiment, when no defective light-emitting element 10 is detected in the light-emitting element array 11 and all of the pixels 13 and all of the sub-pixels 12 of the light-emitting element array 11 are set to be the Bayer array format, each light-emitting element 10 of the light-emitting element array 11 participates in displaying images, and 2*2 sub-pixels 12 in two adjacent rows and two adjacent columns are set to be one pixel unit 14 of the display device 100 for display purposes. The pixel unit 14 consists of two sub-pixels 12G emitting green light, one sub-pixel 12B emitting blue light and one sub-pixel 12R emitting red light, as shown in FIG. 5. In this embodiment, the first unit C1 or the second unit C2 is one pixel unit 14 of the display device 100 for display. That is, the display device 100 performs full-color display by the Bayer array format composed of the first units C1 and the second units C2. In this embodiment, in the pixel unit 14, two sub-pixels 12G emitting green light are distributed diagonally or not diagonally.

In other embodiments, when all of the pixels 13 and all of the sub-pixels 12 are set as full-color arrays of non-Bayer arrays and no defective light-emitting elements 10 are detected in the light-emitting element array 11, 2*2 sub-pixels 12 distributed in two adjacent rows and two columns are configured as one pixel unit 14 of the display device for display purposes. In these embodiments, each pixel unit 14 is consisting of two sub-pixels 12R emitting red light, one sub-pixel 12G emitting green light, and one sub-pixel 12B emitting blue light. Alternatively, each pixel unit 14 can be made of two sub-pixels 12B emitting blue light, one sub-pixel 12G emitting green light, and one sub-pixel 12R emitting red light. Alternatively, each pixel unit 14 can be made of four sub-pixels 12 each emitting light of a different color.

Figure 6:
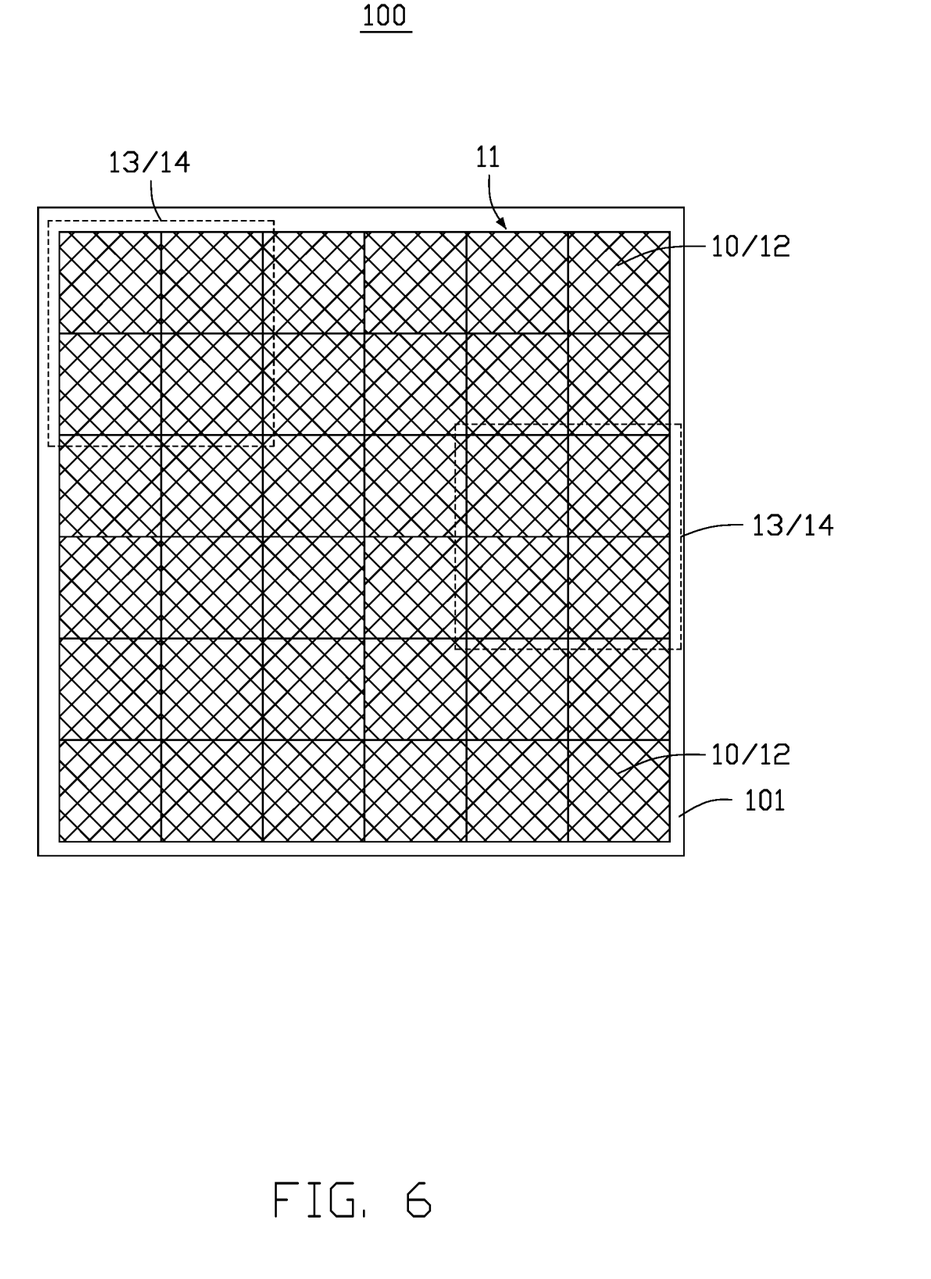
FIG. 6 is a view when all pixels are emitting light of the same color and there are defective light-emitting elements in the light-emitting element array.

In step S4, when defective light-emitting elements 10 are detected in the light-emitting element array 11, the step of setting the resolution of the display device to be an adjustment resolution includes: counting a number of defective light-emitting elements 10 in each pixel 13, and recording a maximum number of defective light-emitting elements 10 in each pixel 13 as M. The adjustment resolution is 1/4 of the maximum resolution, and the M is greater than 0 and less than 4. and the adjustment resolution is less than the maximum resolution. Since the number of sub-pixels 12 in each pixel 13 is 4, in order for each pixel 13 to display normally, a maximum number of defective light-emitting elements 10 that each pixel 13 can tolerate is 3, so M is less than 4. In this embodiment, when defective light-emitting elements 10 are detected in the light-emitting element array 11 and the light-emitting colors of the light-emitting elements 10 of all pixels 13 are set to a grayscale (i.e. when the display device 100 is monochrome display), each pixel 13 is set as one pixel unit 14 when the display device performs display, as shown in FIG. 6. In the present embodiment, when defective light-emitting elements 10 are detected in the light-emitting element array 11 and all of the pixels 13 and all of the sub-pixels 12 are set as full-color arrays, 2*2 pixels 13 distributed in two adjacent rows and two columns are configured as one pixel unit 14 of the display device 100 for display purposes.

In the present embodiment, when defective light-emitting elements 10 are detected in the light-emitting element array 11, each pixel 13 performs light-emitting display by N non-defective light-emitting elements among the four light-emitting elements constituting the pixel 13, where N=4−M. That is, when there are defective light-emitting elements in the light-emitting element array 11, the number of light-emitting elements 10 emitting light in each pixel 13 is the same. In this way, each pixel unit 14 performs display by the same number of light-emitting elements 10, so as to ensure overall light-emitting uniformity during effective display of the light-emitting element array 11.

Figure 7:
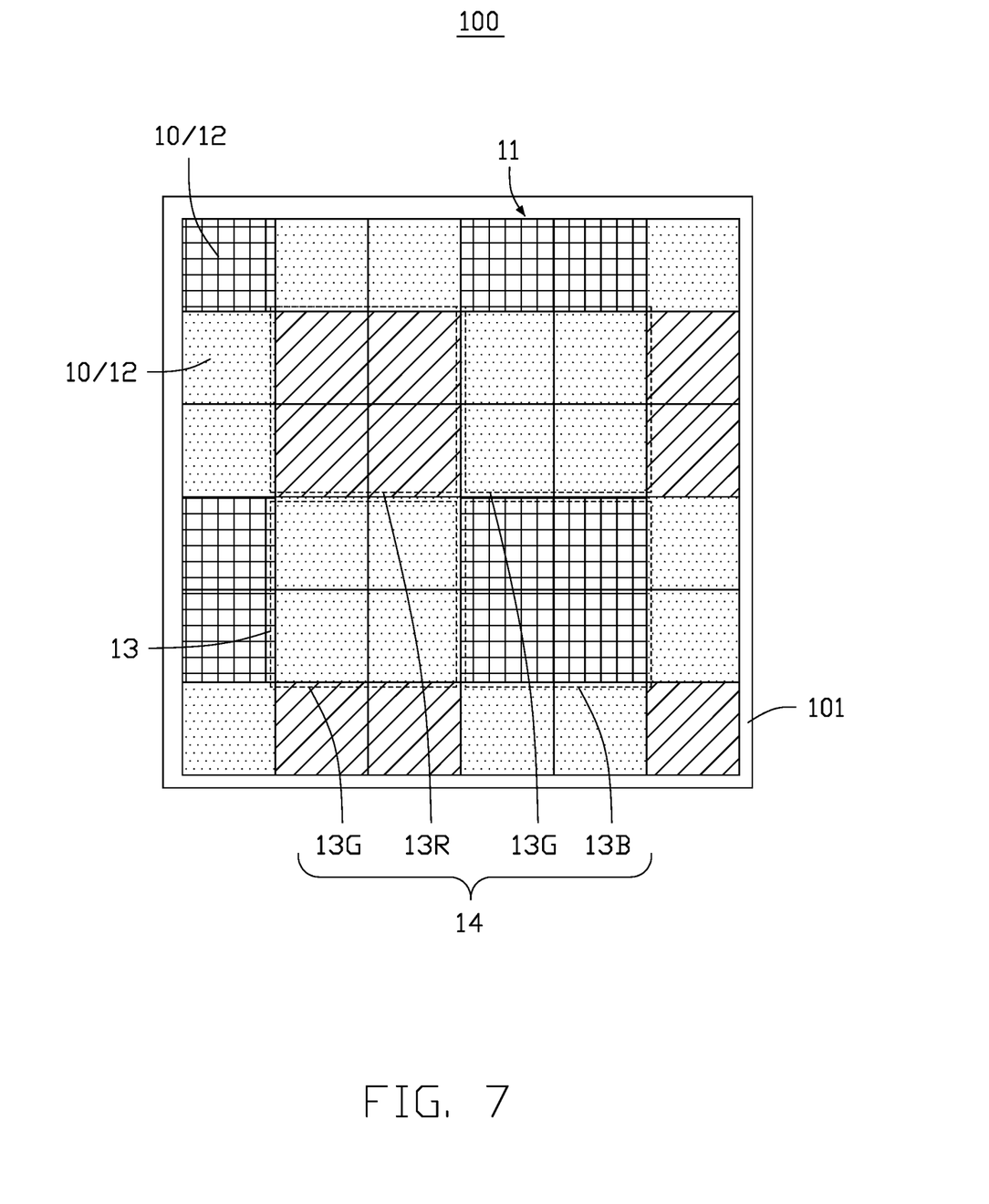
FIG. 7 is a view when the light-emitting element array is arranged as shown in FIG. 4 and there are defective light-emitting elements in the light-emitting element array.

In one embodiment, when defective light-emitting elements 10 are detected in the light-emitting element array 11 and all of the pixels 13 and all of the sub-pixels 12 are set in the Bayer array format, 2*2 pixels 13 distributed in two adjacent rows and two columns are set as one pixel unit 14 of the display device 100 during display, as shown in FIG. 7. In this embodiment, each pixel unit 14 is consisting of two pixels 13G emitting green light, one pixel 13R emitting red light, and one pixel 13B emitting blue light. The display device 100 performs full-color display by the Bayer array format composed of the pixel units 14. That is, the display device 100 performs full-color display in the Bayer array format composed of the third units C3. In each pixel unit 14, two pixels 13G emitting green light are distributed diagonally or non-diagonally. In other embodiments, when defective light-emitting elements 10 are detected in the light-emitting element array 11 and all of the pixels 13 and all of the sub-pixels 12 are set as a full-color array of non-Bayer array, each pixel unit 14 of the display device 100 can consist of two pixels 13R emitting red light, one pixel 13G emitting green light, and one pixel 13B emitting blue light. Alternatively, each pixel unit 14 can be made of two pixels 13B emitting blue light, one pixel 13G emitting green light, and one pixel 13R emitting red light. Alternatively, each pixel unit 14 can be made of four pixels 13 with different light-emitting colors.

In the embodiments, method of making the display device activates a display in the form of maximum resolution and adjustment resolution, so as to distinguish products which have different resolutions. When there are defective light-emitting elements 10 in the light-emitting element array 11, the resolution of such display device 100 including the light-emitting element array 11 is configured to adjust the resolution. Although at this time the resolution of the display device 100 is less than the maximum resolution, the display device 100 including defective light-emitting elements 10 can be sold in a reduced form, which improves the overall manufacturing yield. Moreover, when there is a defective light-emitting element 10 in the light-emitting element array 11 in the display device 100, a normal display can be achieved by the light-emitting element array 11 without repair of the defective light-emitting elements 10. Thus, the method of making the display device of the disclosure reduces the time and cost of repair process of light-emitting elements 10 and saves the cost of using the standby light-emitting element.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method of making a display device, comprising:
    forming a plurality of light-emitting elements on a substrate defining a plurality of sub-pixels; each of the plurality of sub-pixels comprising one of the plurality of light-emitting elements; the plurality of light-emitting elements being arranged to be a light-emitting element array, the display device defining a plurality of pixels, each of the plurality of pixels comprising 2*2 sub-pixels in two adjacent rows and two adjacent columns, the light-emitting elements in each of the plurality of pixels configured to emit light of same color;
    detecting whether each of the plurality of light-emitting elements is defective and recording positions of the light-emitting elements that are defective in the light-emitting element array;
    setting a resolution of the display device to be a maximum resolution when it is detected that there is no defective light-emitting element in the light-emitting element array;
    setting a resolution of the display device to be an adjustment resolution when it is detected that there are defective light-emitting elements in the light-emitting element array, and the adjustment resolution being less than the maximum resolution; and
    when no defective light-emitting element is detected, and when all of the plurality of pixels and all of the plurality of sub-pixels are set to be full-color array, setting each of the plurality of light-emitting elements participates in displaying image, and configuring the 2*2 sub-pixels in two adjacent rows and two adjacent columns to be a pixel unit of the display device for light-emitting display.

2. The method of claim 1, wherein the pixel unit consists of two sub-pixels emitting green light, one sub-pixel emitting blue light, and one sub-pixel emitting red light.

3. The method of claim 1, wherein the pixel unit consists of two sub-pixels emitting red light, one sub-pixel emitting green light, and one sub-pixel emitting blue light.

4. The method of claim 1, wherein the pixel unit consists of two sub-pixels emitting blue light, one sub-pixel emitting green light, and one sub-pixel emitting red light.

5. The method of claim 1, wherein the pixel unit consists of four sub-pixels emitting light of four different colors.

6. The method of claim 1, wherein when it is detected that there are defective light-emitting elements in the light-emitting element array, the step of setting the resolution of the display device to be the adjustment resolution comprises: counting a number of defective light-emitting elements in each of the plurality of pixels, recording a maximum number of defective light-emitting elements in the plurality of pixels as M, and the adjustment resolution is ¼ of the maximum resolution, and the M is greater than 0 and less than 4.

7. The method of claim 6, wherein each of the plurality of pixels performs light-emitting display by N undefective light-emitting elements among the four light-emitting elements constituting the pixel, wherein N=4−M.

8. The method of claim 1, wherein when it is detected that there are defective light-emitting elements and both all of the plurality of pixels and all of the plurality of sub-pixels are set to be full-color array, 2*2 pixels in two adjacent rows and two adjacent columns are configured to be a pixel unit of the display device for light-emitting display.

9. The method of claim 8, wherein the pixel unit consists of two pixels emitting green light, one pixel emitting blue light, and one pixel emitting red light;
    or the pixel unit consists of two pixels emitting red light, one pixel emitting green light, and one pixel emitting blue light;
    or the pixel unit consists of two pixels emitting blue light, one pixel emitting green light, and one pixel emitting red light;
    or the pixel unit consists of four pixels emitting light of four different colors.

10. The method of claim 8, wherein the plurality of sub-pixels and the plurality of pixels form Bayer array format; the plurality of sub-pixels form a plurality of first units, a plurality of second units, and a plurality of third units;
    each of the plurality of first units consists of 2*2 sub-pixels comprising two green sub-pixels emitting green light along a first diagonal, one red sub-pixel emitting red light, and one blue sub-pixel emitting blue light;
    each of the plurality of second units consists of 2*2 sub-pixels comprising two green sub-pixels emitting green light along a second diagonal, one red sub-pixel emitting red light, and one blue sub-pixel emitting blue light;

the first diagonal and the second diagonal are perpendicular to each other, and the first unit and the second unit are alternately distributed in both X and Y directions;

each of the plurality of third units consists of 2*2 pixels comprising two green pixels emitting green light along a third diagonal, one red pixel emitting red light, and one blue pixel emitting blue light;

the third units are repeatedly distributed in the X and Y directions, the third diagonal is parallel to the first diagonal.

* * * * *